United States Patent [19]

Osborn et al.

[11] Patent Number: 5,560,572

[45] Date of Patent: Oct. 1, 1996

[54] INSTRUMENT PANEL DOVETAIL SLIDE MOUNTING ASSEMBLY

[75] Inventors: David R. Osborn, Waterford, Mich.; Robert A. Marrs, Amboy, Ind.

[73] Assignees: General Motors Corporation, Detroit, Mich.; Delco Electronics Corporation, Kokomo, Ind.

[21] Appl. No.: 311,970

[22] Filed: Sep. 26, 1994

[51] Int. Cl.⁶ .................................................. G12B 9/00
[52] U.S. Cl. .................................. 248/27.3; 248/224.61; 248/201; 248/904
[58] Field of Search .............................. 248/27.3, 27.1, 248/224.1, 201, 904; 312/7.1

[56] References Cited

U.S. PATENT DOCUMENTS

| | | | |
|---|---|---|---|
| 3,903,458 | 9/1975 | Arnoux | 248/27.1 |
| 4,047,686 | 9/1977 | Porter | 248/203 |
| 4,063,683 | 12/1977 | Jones | 339/119 R |
| 4,309,012 | 1/1982 | Fukunaga | 248/27.1 |
| 4,371,743 | 2/1983 | Decker | 174/52 |
| 4,524,933 | 6/1985 | Rouws | 248/27.3 |
| 4,572,465 | 2/1986 | Rasca | 248/27.1 |
| 4,577,818 | 3/1986 | Clarisse | 248/27.3 |
| 4,679,026 | 7/1987 | Knakowski et al. | 340/63 |
| 4,687,172 | 8/1987 | Stillback | 248/551 |
| 4,848,716 | 7/1989 | Nakamoto | 248/553 |
| 4,947,661 | 8/1990 | Yoshida | 70/57 |
| 4,955,678 | 9/1990 | Kobayashi | 312/7.1 |
| 4,993,668 | 2/1991 | Inamura | 248/27.3 |
| 5,381,684 | 1/1995 | Kawamura | 248/27.3 |

FOREIGN PATENT DOCUMENTS 2162239  1/1986  United Kingdom .

*Primary Examiner*—Karen J. Chotkowski
*Assistant Examiner*—Anita M. King
*Attorney, Agent, or Firm*—Howard N. Conkey; Kathryn A. Marra

[57] ABSTRACT

A device, such as a radio, has opposing vertical sides and a vehicle instrument panel includes a recess having a rearward access opening and opposing spaced apart side walls. Each side wall of the instrument panel recess includes an integrally formed longitudinally extending tapered dovetail rail. A pair of tapered dovetail slide members are each adapted to be fixedly mounted to an opposite side of the device. Each slide member includes an integral upper and lower finger transversely cantilevered away from the device. The upper and lower fingers are vertically spaced apart for matably receiving the respective dovetail rail therebetween by interference-fitted engagement therewith when the device is longitudinally inserted into the recess of the instrument panel. Thus, the slide members and dovetail rails cooperatively secure the device to the recess of the instrument panel to prevent movement of the device relative the instrument panel.

14 Claims, 4 Drawing Sheets

INSTRUMENT PANEL DOVETAIL SLIDE MOUNTING ASSEMBLY

This invention relates to a mounting assembly in a vehicle, and more particularly to a mechanism for securely mounting a device such as a radio in a recess formed in an instrument panel.

BACKGROUND OF THE INVENTION

It is well known in motor vehicles to have a device such as a radio, cassette player, or compact disc player which is mounted in a recess formed in the instrument panel of the vehicle. There are also many mechanisms known for mounting the device to the recess in the instrument panel. Typically, these mechanisms include some type of bracket or brackets which are fastened onto two or more sides of the device by a multiplicity of fasteners. In addition, an insert or adapter component is also typically fastened to the instrument panel or within the instrument panel recess for making the brackets compatible for mounting. Since these mounting mechanisms are typically designed separately from or after design of the vehicle, they are typically complex and require many components including multiple fasteners which add time and cost to assembly and repairability of the device.

Some mounting mechanisms are directed to theft prevention of the device and allow for easy insertion and removal of the device when the vehicle is not in use. However, these mechanisms are not concerned with the compatibility of the device to the instrument panel during initial vehicle assembly. Thus, these mechanisms may still contain numerous components, including fasteners to accomplish compatibility between the device and the vehicle instrument panel.

SUMMARY OF THE INVENTION

This invention provides an improved mounting assembly for attaching a device, such as a radio, to a recess in a vehicle instrument panel which allows for simple snap-together assembly utilizing a minimum number of components. This is accomplished by designing the instrument panel, device, and mounting components as a system to allow snap-fitted engagement and facile removal of the device without the use of fasteners or tools, thus minimizing assembly time.

In accordance with the present invention, a device, such as a radio, has opposing vertical sides. A vehicle instrument panel includes a recess having a rearward access opening and opposing spaced apart side walls. Each side wall of the instrument panel recess includes an integrally formed longitudinally extending tapered dovetail rail. For ease of assembly, the tapered dovetail rail has a rearward vertical dimension lesser than a forward vertical dimension.

A pair of tapered dovetail slide members are each adapted to be fixedly mounted to an opposite side of the device. Each slide member includes an integral upper and lower finger transversely cantilevered away from the device. The upper and lower fingers are vertically spaced apart for matably receiving the respective dovetail rail therebetween by interference-fitted engagement therewith when the device is longitudinally inserted into the recess of the instrument panel.

Thus, the slide members and dovetail rails cooperatively secure the device to the recess of the instrument panel to prevent movement of the device relative the instrument panel.

Advantageously, the present invention provides an improved mounting assembly which permits simple attachment of a device assembly, such as a radio assembly, to a recess in a vehicle instrument panel without the use of fasteners or tools. In addition, assembly time is greatly reduced since the slide members may be quickly snapped onto the sides of the device to form the device assembly which is then quickly snapped into the instrument panel recess.

The present invention is characterized by providing ease of assembly and disassembly and minimization of components in the mounting of a device assembly, such as a radio assembly, to a recess in an instrument panel.

BRIEF DESCRIPTION OF THE DRAWINGS

These and other features, objects and advantages of the present invention will become apparent upon consideration of the following description of the preferred embodiment, appended claims, and accompanying drawings in which:

DESCRIPTION OF THE PREFERRED EMBODIMENT

Figure 1:
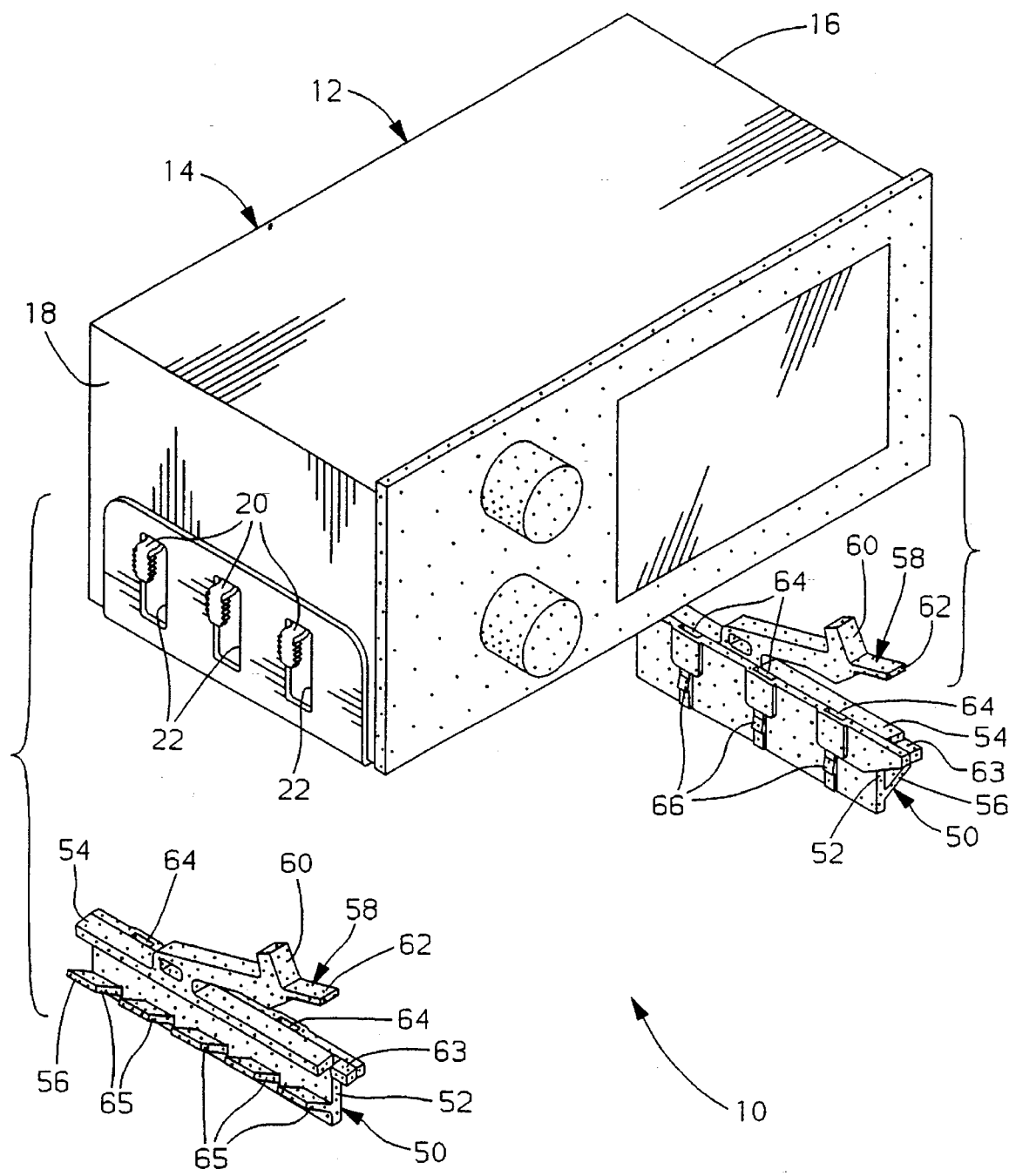
FIG. 1 is an exploded perspective view of a device assembly, such as a radio assembly, including a radio and a pair of tapered dovetail slide members.
Figure 2:
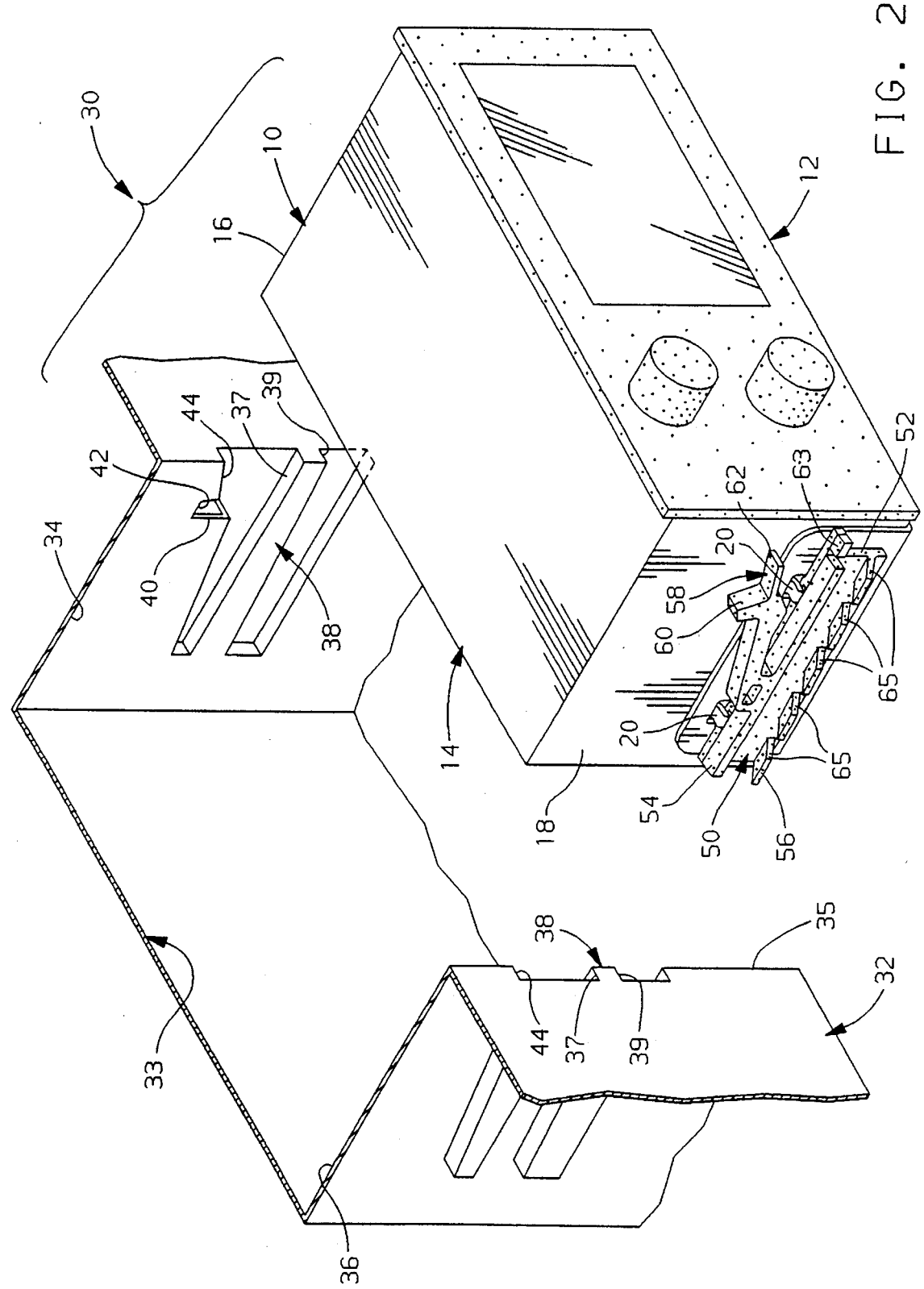
FIG. 2 is an exploded perspective view of a mounting assembly showing the device assembly including the device with the slide members mounted thereon and showing the instrument panel partially-broken-away.

Referring to FIGS. 1–2, a mounting assembly, generally designated as 30, is comprised of a device assembly 10 including a device 12, such as a radio, cassette player, or compact disc player, a pair of slide members 50 mounted on opposing sides 16, 18 of a casing 14 of the device 12, and an instrument panel 32 having a recess 33 with a rearward opening 35 for receiving the device assembly 10 therein. The rearward opening 35 is located forward of the front passenger seating compartment in a vehicle (not shown). The forward and rearward directions in this description are consistent with the forward and rearward directions on the vehicle.

Referring to FIG. 2, it is seen that the recess 33 of the instrument panel 32 includes opposing parallel vertical side walls 34, 36 being laterally spaced apart for closely receiving the device 12 with the slide members 50 mounted thereon. Each side wall 34, 36 of the recess 33 includes an integrally formed longitudinally extending tapered dovetail rail, similarly designated as 38. Each dovetail rail 38 has an upper surface 37, a lower surface 39, and a rearward vertical dimension lesser than a forward vertical dimension.

Each side wall 34, 36 of the recess 33 of the instrument panel 32 further includes an integrally formed vertically disposed cavity 42 aligned above each respective dovetail rail 38. Each side wall 34, 36 of the recess 33 further includes a vertical stop 40 extending downwardly directly forward of the cavity 42 to limit forward longitudinal insertion of the device 12 within the recess 33, as will be described hereinafter. A cam surface 44 being angled downwardly in a forward direction is positioned directly rearward of the cavity 42 to assist with insertion of the device 12 into the recess 33, as will be described hereinafter.

The device 12 has a box-like casing 14 with opposing vertical sides 16, 18. Each of the sides 16, 18 includes a plurality of vertically disposed hooks 20 depending outwardly from the casing 14 of the device 12 and bent downwardly to extend parallel to the sides 16, 18 of the device 12. The hooks 20 each preferably include serrated forward and rearward edges for tighter engagement with the slide members 50, as will be further described. The casing 14 of the device 12 further includes a plurality of notched or stepped portions 22 vertically aligned below each respective hook 20.

The pair of slide members 50 are each a single molded component preferably formed of a resilient material such as a polymeric resin. The slide members 50 are each elongate in a longitudinal direction and sized to substantially extend along the longitudinal length of the sides 16, 18 of the device 12. The slide members 50 are each adapted for press-fitted engagement with opposite sides 16, 18 of the casing 14 of the device 12 without the use of fasteners or tools, as will now be described.

Figure 5:
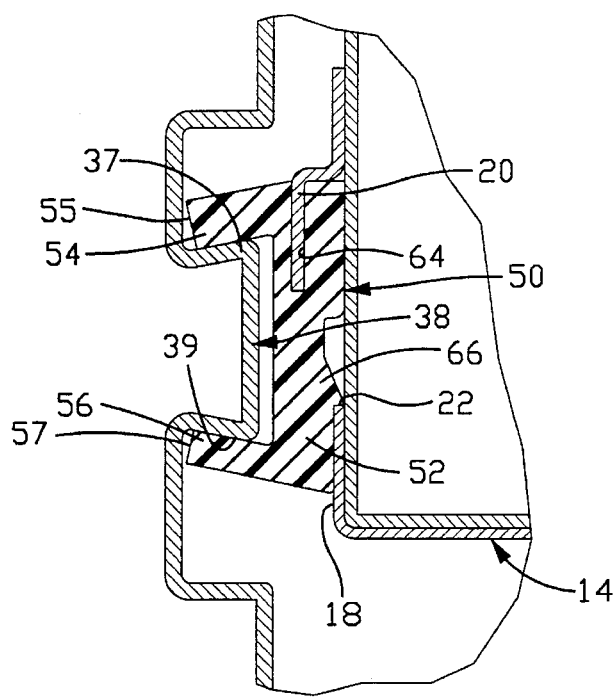
FIG. 5 is a sectional view taken along line 5—5 of FIG. 4.

As best shown in FIGS. 1 and 5, the slide members 50 each include a vertically disposed base portion 52 which is parallel to the respective side 16, 18 of the device 12 when mounted thereto. The base portion 52 includes a plurality of vertical slots 64 aligned for receiving a respective hook 20 of the device 12 therein by press-fitted engagement therewith. The base portion 52 preferably includes a plurality of transversely extending locking tabs 66 located adjacent the device 12 and vertically aligned beneath a respective slot 64. As best shown in FIG. 5, the locking tabs 66 are complementary shaped for snap-fitted engagement with a respective notched portion 22 on the casing 14 of the device 12 when the hooks 20 are fully inserted into the slots 64 on the slide members 50. The slots 64 and locking tabs 66 are vertically dimensioned such that the locking tabs 66 snap-fittedly engage with the notched portions 22 only when the hooks 20 are completely installed in the slots 64 to provide dual snap-in retaining features insuring complete attachment of the slide members 50 to the device 12 prior to insertion of the device 12 into the recess 33.

Referring to FIGS. 1 and 2, the device assembly 10 is comprised of only three components, the device 12 and the pair of slide members 50. The device assembly 10 is assembled as follows. First, the slots 64 of each of the slide members 50 are matably aligned beneath the respective hooks 20 on the device 12. Next, the hooks 20 are press-fittedly inserted into respective slots 64 on the slide members 50 until complete insertion is achieved as indicated by the locking tabs 66 on the slide members 50 snap-fittedly engaging with the notched portions 22 on the device 12. Thus, the hooks 20, notched portions 22, slots 64 and locking tabs 66 cooperatively provide dual snap-in retaining features for fixedly mounting the slide members 50 to the device 12. In addition, the snap-in engagement of the locking tabs 66 and notched portions 22 provides tactile feedback during assembly verifying that the slide members 50 are securely mounted to the device 12 before insertion into the recess 33 of the instrument panel 32.

The slide members 50 are adapted for slidably receiving a respective dovetail rail 38 of the recess 33 by interference-fitted engagement therewith to securely mount the device assembly 10 to the instrument panel 32. To accomplish this, the slide members 50 each include integrally formed upper and lower fingers 54, 56, respectively, transversely cantilevered outwardly from the base portion 52 of each slide member 50 away from the device 12. The upper and lower fingers 54, 56 are vertically spaced apart by a predetermined distance to cooperatively form a mating dovetail slide for receiving the respective dovetail rail 38 therebetween by interference-fitted engagement therewith when the device assembly 10 is longitudinally inserted into the recess 33 of the instrument panel 32.

As best shown in FIG. 5, the upper and lower fingers 54, 56 each have free ends 55, 57, respectively, converging towards each other and vertically spaced apart less than a mating vertical dimension of the dovetail rail 38 such that the fingers 54, 56 are self-biased against the dovetail rail 38 upon insertion of the device assembly 10 into the recess 30, thus preventing vertical movement of the device 12 relative the instrument panel 32.

The slide members 50 each further include a deflectable locking arm 58 depending longitudinally from and positioned in parallel alignment above the upper finger 54. The arm 58 includes a generally upwardly projecting protrusion 60 aligned for snap-fitted engagement with the respective cavity 42 in the recess 33 upon full insertion of the device 12 into the recess 33 such that longitudinal movement of the device 12 relative the instrument panel 32 is prevented.

Figure 3:
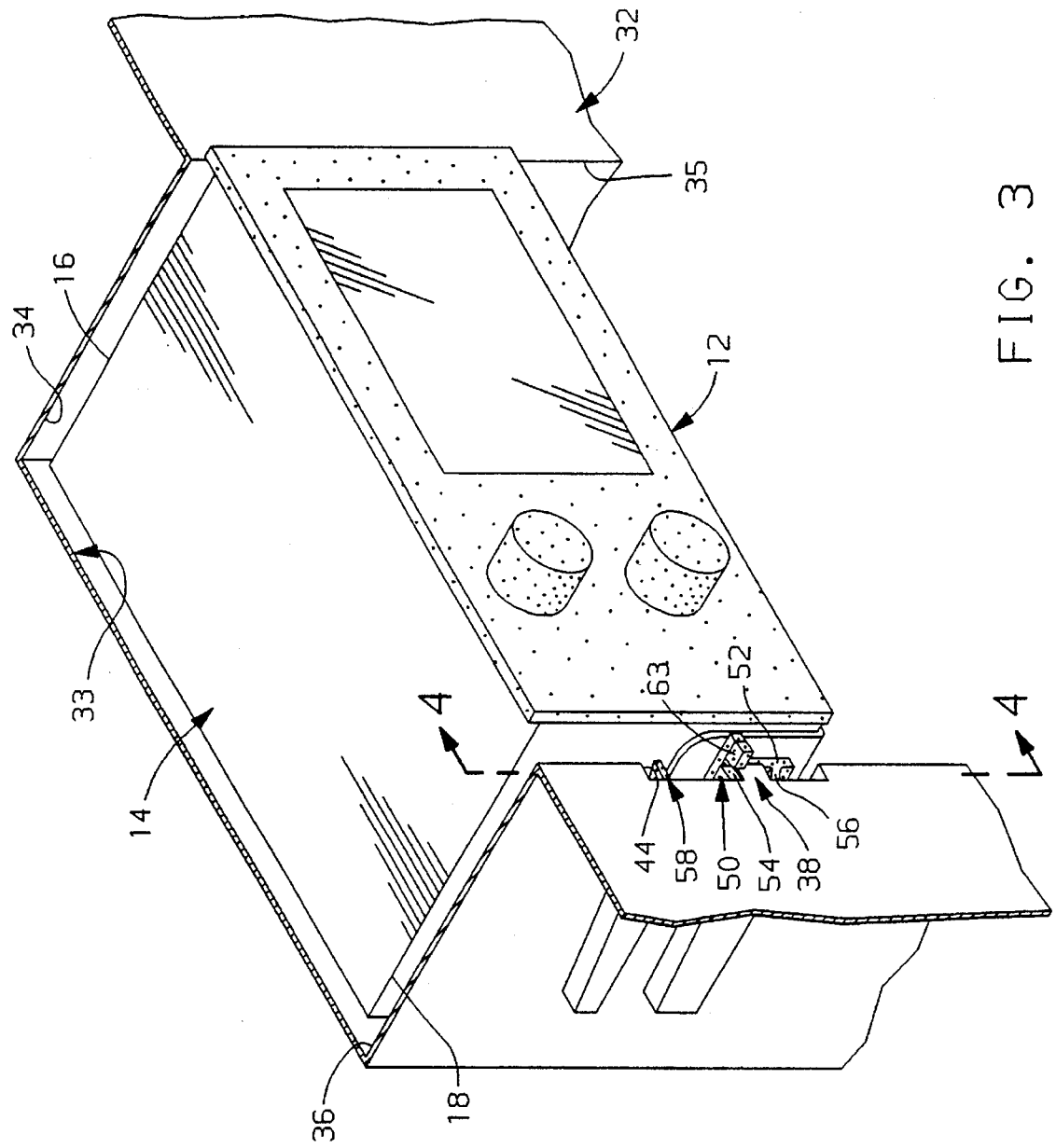
FIG. 3 is a view similar to FIG. 2, but showing the device assembly mounted to the instrument panel.
Figure 4:
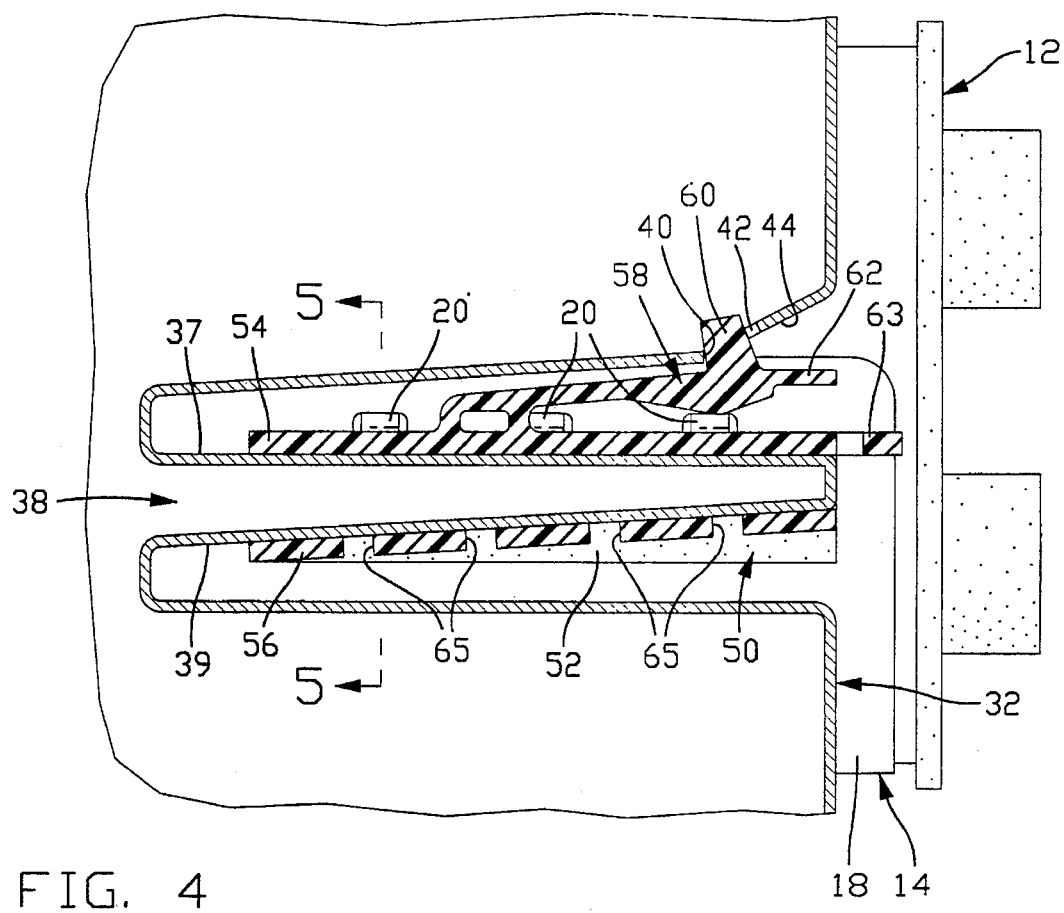
FIG. 4 is a sectional view taken along line 4—4 of FIG. 3.

Referring to FIGS. 2–4, to complete the mounting assembly 30, the upper and lower fingers 54, 56 of the slide members 50 of the device assembly 10 are matably aligned for receiving the respective dovetail rails 38 therebetween, and the device assembly 10 is longitudinally inserted in a forward direction into the rearward access opening 35 of the instrument panel 32. Since the upper and lower fingers 54, 56 each have free ends 55, 57 converging towards each other, the fingers 54, 56 are biased against the dovetail rail 38 upon full insertion of the device 12 into the recess 33 such that vertical movement of the device 12 relative the instrument panel 32 is prevented.

During insertion of the device assembly 10, the protrusion 60 on the arm 58 of each slide member 50 slidably engages the respective angled cam surface 44 on the recess 33 to permit easy forward longitudinal insertion of the device assembly 10. Insertion is complete when the protrusion 60 of each slide member 50 engages the respective stop 40 rearward the respective cavity 42 of the recess 33 such that the protrusion 60 is aligned for snap-fitted engagement within the cavity 42. Engagement of the protrusion 60 with the cavity 42 prevents further forward longitudinal movement of the device 12 and also prevents removal of the device assembly 10 back through the rearward opening 35 of the instrument panel 32.

To further accomplish vibration reduction, the lower finger 56 of each slide member 50 preferably includes a plurality of transversely extending slits 65 permitting greater flexibility of the lower finger 56 when engaging the dovetail rail 38 such that the lower finger 56 is tightly biased against the bottom surface 39 of the dovetail rail 38 to prevent rattling of the device assembly 10 relative the instrument panel 32 and for ease of assembly.

To permit facile removal of the device assembly 10 from the recess 33 of the instrument panel 32, the deflectable arm 58 is provided with a release lever 62 extending rearwardly the protrusion 60. The release lever 62 is downwardly deflectable such that the protrusion 60 may be displaced out of the cavity 42 and the device 12 is movable in a rearward direction for removal from the recess 33 in the instrument panel 32.

Removal of the device assembly 10 is simply accomplished by pushing downwardly on the release lever 62 until the protrusion 60 is released from the cavity 42. Then, the device assembly 10 is easily removable from the recess 33 by pulling rearwardly in the longitudinal direction.

To further assist with removal of the device assembly 10 from the recess 33, the upper finger 54 of each slide member 50 preferably includes a rearwardly extending handle 63 that may be gripped to assist with release of the deflectable arm 58 and rearwardly pulling of the device assembly 10.

It will be appreciated that the slide members 50 and mating dovetail rails 38 cooperatively secure the device assembly 10 within the recess 33 of the instrument panel 32 during vehicle use.

It will further be appreciated that a trim cover (not shown) may be secured around the device 12 and rearward opening 35 of the instrument panel 32 after completing the mounting assembly 30, for decorative purposes or to limit access to the device assembly.

It will also be appreciated that the integral dovetail rails 38 and mating slide members 50 press-fitted onto the device 12 provide an improved mounting mechanism permitting simple assembly of the device 12 to a recess 33 in the instrument panel 32, without the use of fasteners or tools. Thus, assembly time is reduced since the slide members 50 are quickly snapped onto the device 12, and the device assembly 10 is quickly snapped into the recess 33. It will further be appreciated that the use of longitudinally extending dovetail rails 38 and mating slide members 50 provide a mounting assembly 30 which reduces vibration and rattling of the device 12 relative the instrument panel 32.

While the present invention has been described as carried out in a specific embodiment thereof, it is not intended to be limited thereby but is intended to cover the invention broadly within the scope and spirit of the appended claims.

The invention claimed is:

1. A mounting assembly comprising:

a device including opposing vertical sides;

an instrument panel including a recess having a rearward access opening and opposing spaced apart side walls, each side wall including an integrally formed longitudinally extending tapered dovetail rail; and a pair of tapered dovetail slide members, each adapted to be fixedly mounted to an opposite side of the device, each including an integral upper and lower finger transversely cantilevered away from the device, the upper and lower fingers being vertically spaced apart for matably receiving the respective dovetail rail therebetween by interference-fitted engagement therewith when the device is longitudinally inserted into the recess of the instrument panel, the lower finger of each dovetail slide member including a plurality of laterally extending slits permitting flexing of the lower finger upon engagement with the dovetail rail such that the lower finger is biased against the dovetail rail to prevent vibration of the device relative the instrument panel;

whereby the slide members and dovetail rails cooperatively secure the device to the recess of the instrument panel to prevent movement of the device relative the instrument panel.

2. The mounting assembly of claim 1 wherein the upper and lower fingers each have free ends converging towards each other such that the fingers are biased against the dovetail rail upon insertion of the device into the recess to prevent vertical movement of the device relative the instrument panel.

3. A mounting assembly comprising:

a device including opposing vertical sides;

an instrument panel including a recess having a rearward access opening and opposing spaced apart side walls, each side wall including an integrally formed longitudinally extending tapered dovetail rail;

a pair of tapered dovetail slide members, each adapted to be fixedly mounted to an opposite side of the device, each including an integral upper and lower finger transversely cantilevered away from the device, the upper and lower fingers being vertically spaced apart for matably receiving the respective dovetail rail therebetween by interference-fitted engagement therewith when the device is longitudinally inserted into the recess of the instrument panel; and each side wall of the recess in the instrument panel including an integrally formed cavity aligned above each respective dovetail rail, and each slide member including a deflectable locking arm cantilevered from the upper finger and including an upwardly projecting protrusion aligned for snap-fitted engagement with the respective cavity in the recess upon full insertion of the device into the recess such that longitudinal movement of the device relative the instrument panel is prevented;

whereby the slide members and dovetail rails cooperatively secure the device to the recess of the instrument panel to prevent movement of the device relative the instrument panel.

4. The mounting assembly of claim 3 wherein the deflectable arm includes a release lever extending rearwardly from the protrusion and being downwardly deflectable such that the protrusion is displaced out of the cavity such that the device is movable in a rearward direction for removal from the recess in the instrument panel.

5. The mounting assembly of claim 3 wherein the recess includes an integral cam surface angled downwardly in a forward direction and positioned directly rearward the cavity for slidably engaging and downwardly deflecting the protrusion upon insertion of the device to allow facile forward longitudinal insertion of the device into the recess of the instrument panel.

6. A mounting assembly comprising:

a device including opposing vertical sides;

an instrument panel including a recess having a rearward access opening and opposing spaced apart side walls, each side wall including an integrally formed longitudinally extending tapered dovetail rail and an integrally formed cavity aligned above each respective dovetail rail; and a pair of tapered dovetail slide members, each being a single molded component including an integral vertically disposed base portion adapted to be fixedly mounted to a respective side of the device, integral upper and lower fingers transversely cantilevered from the base portion away from the device, the upper and lower fingers being vertically spaced apart for matably receiving the respective dovetail rail therebetween by interference-fitted engagement therewith when the device is longitudinally inserted into the recess of the instrument panel, and a deflectable locking arm cantilevered from the upper finger and including an upwardly projecting protrusion aligned for snap-fitted engagement with the respective cavity in the recess upon full insertion of the device into the recess such that longitudinal movement of the device relative the instrument panel is prevented;

whereby the dovetail slide members and dovetail rails cooperatively secure the device to the recess of the instrument panel to prevent movement of the device relative the instrument panel.

7. The mounting assembly of claim 6 wherein the upper and lower fingers each have free ends converging towards each other such that the fingers are biased against the dovetail rail upon insertion of the device into the recess to prevent vertical movement of the device relative the instrument panel.

8. The mounting assembly of claim 7 wherein the lower finger of the each dovetail slide member includes a plurality of laterally extending slits permitting flexing of the lower finger upon engagement with the dovetail rail such that the lower finger is biased against the dovetail rail to prevent vibration of the device relative the instrument panel.

9. The mounting assembly of claim 6 wherein the deflectable arm includes a release lever extending rearwardly from the protrusion and being downwardly deflectable such that the protrusion is displaced out of the cavity such that the device is movable in a rearward direction for removal from the recess in the instrument panel.

10. The mounting assembly of claim 6 wherein the recess includes an integral cam surface angled downwardly in a forward direction and positioned directly rearward the cavity for slidably engaging and downwardly deflecting the protrusion upon insertion of the device to allow facile forward longitudinal insertion of the device into the recess of the instrument panel.

11. The mounting assembly of claim 6 wherein the base portion of the slide member and the sides of the device cooperatively provide dual snap-in features for permitting press-fitted engagement of the base portion onto the sides of the device for securely mounting the dovetail slide members to the device, the base portion being parallel with the sides of the device when mounted thereto.

12. The mounting assembly of claim 11 wherein the sides of the device each include a plurality of vertically disposed hooks depending therefrom and a plurality of notched portions aligned beneath respective hooks, and the base portions of the slide members each include a plurality of vertically disposed slots aligned for receiving a respective hook on the device therein by force fitted engagement therewith and a plurality of locking tabs positioned beneath the slots and aligned for snap-fitted engagement with the notches on the device when the hooks are fully inserted into the slots, whereby the hooks, slots, notched portions, and locking tabs cooperatively provide dual snap-in features for securely mounting the slide members to the device.

13. A mounting assembly comprising:

a device having opposing vertical sides each including a plurality of vertically disposed hooks depending therefrom and a plurality of notched portions aligned beneath respective hooks;

an instrument panel including a recess having a rearward access opening and opposing spaced apart side walls, each side wall including an integrally formed longitudinally extending tapered dovetail rail; and a pair of tapered dovetail slide members, each adapted to be fixedly mounted to an opposite side of the device by press-fitted engagement therewith, each slide member including a plurality of vertically disposed slots aligned for receiving a respective hook on the device therein by force fitted engagement therewith, a plurality of locking tabs positioned beneath the slots and aligned for snap-fitted engagement with the notched portions on the device when the hooks are fully inserted into the slots, and an integral upper and lower finger transversely cantilevered away from the device, the upper and lower fingers being vertically spaced apart for matably receiving the respective dovetail rail therebetween by interference-fitted engagement therewith when the device is longitudinally inserted into the recess of the instrument panel;

whereby the hooks, slots, notched portions, and locking tabs cooperatively provide dual snap-in features for securely mounting slide members to the device and the slide members and dovetail rails cooperatively secure the device to the recess of the instrument panel to prevent movement of the device relative the instrument panel.

14. The mounting assembly of claim 13 wherein the hooks include serrated edges.

* * * * *